(12) United States Patent
Chou et al.

(10) Patent No.: US 9,837,319 B2
(45) Date of Patent: Dec. 5, 2017

(54) ASYMMETRIC HIGH-K DIELECTRIC FOR REDUCING GATE INDUCED DRAIN LEAKAGE

(71) Applicant: INTERNATIONAL BUSINESS MACHINES CORPORATION, Armonk, NY (US)

(72) Inventors: Anthony I. Chou, Beacon, NY (US); Arvind Kumar, Beacon, NY (US); Chung-Hsun Lin, White Plains, NY (US); Shreesh Narasimha, Beacon, NY (US); Claude Ortolland, Peekskill, NY (US); Jonathan T. Shaw, Rego Park, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/076,036

(22) Filed: Mar. 21, 2016

(65) Prior Publication Data

US 2016/0204214 A1    Jul. 14, 2016

Related U.S. Application Data

(62) Division of application No. 14/553,521, filed on Nov. 25, 2014, now Pat. No. 9,412,667.

(51) Int. Cl.
*H01L 21/8234* (2006.01)
*H01L 21/28* (2006.01)
(Continued)

(52) U.S. Cl.
CPC .. *H01L 21/823462* (2013.01); *H01L 21/0223* (2013.01); *H01L 21/02181* (2013.01); *H01L 21/02247* (2013.01); *H01L 21/02255* (2013.01); *H01L 21/02323* (2013.01); *H01L 21/02332* (2013.01); *H01L 21/265* (2013.01); *H01L 21/26586* (2013.01); *H01L 21/28176* (2013.01);
(Continued)

(58) Field of Classification Search
CPC ................ H01L 29/42356; H01L 29/42368
See application file for complete search history.

(56) References Cited

U.S. PATENT DOCUMENTS 6,090,671 A    7/2000  Balasubramanyam et al.
6,853,048 B1   2/2005  Wylie
(Continued)

OTHER PUBLICATIONS

"List of IBM Patents or Patent Applications Treated as Related" 1 page.
(Continued)

*Primary Examiner* — Joseph C Nicely
(74) *Attorney, Agent, or Firm* — Steven J. Meyers; Andrew M. Calderon; Roberts Mlotkowski Safran Cole & Calderon, P.C.

(57) ABSTRACT

An asymmetric high-k dielectric for reduced gate induced drain leakage in high-k MOSFETs and methods of manufacture are disclosed. The method includes performing an implant process on a high-k dielectric sidewall of a gate structure. The method further includes performing an oxygen annealing process to grow an oxide region on a drain side of the gate structure, while inhibiting oxide growth on a source side of the gate structure adjacent to a source region.

13 Claims, 6 Drawing Sheets

(51) Int. Cl.
| | |
|---|---|
| *H01L 29/51* | (2006.01) |
| *H01L 21/265* | (2006.01) |
| *H01L 29/66* | (2006.01) |
| *H01L 29/423* | (2006.01) |
| *H01L 21/02* | (2006.01) |
| *H01L 21/426* | (2006.01) |
| *H01L 21/3115* | (2006.01) |
| *H01L 21/324* | (2006.01) |
| *H01L 29/40* | (2006.01) |
| *H01L 21/84* | (2006.01) |

(52) U.S. Cl.
CPC .. *H01L 21/28185* (2013.01); *H01L 21/31155* (2013.01); *H01L 21/324* (2013.01); *H01L 21/426* (2013.01); *H01L 21/845* (2013.01); *H01L 29/401* (2013.01); *H01L 29/42356* (2013.01); *H01L 29/42368* (2013.01); *H01L 29/512* (2013.01); *H01L 29/517* (2013.01); *H01L 29/6656* (2013.01); *H01L 29/66545* (2013.01)

(56) References Cited

U.S. PATENT DOCUMENTS

| | | | |
|---|---|---|---|
| 7,585,735 B2 | 9/2009 | Matthew et al. | |
| 7,829,945 B2 | 11/2010 | Adkisson et al. | |
| 7,948,028 B2 | 5/2011 | Renn | |
| 7,994,559 B2 | 8/2011 | Wang et al. | |
| 8,343,829 B2 | 1/2013 | Wang et al. | |
| 8,629,022 B2 | 1/2014 | Chidambarrao et al. | |
| 8,679,906 B2 | 3/2014 | Cheng | |
| 9,412,667 B2 | 8/2016 | Chou et al. | |
| 9,543,213 B2 | 1/2017 | Chou et al. | |
| 9,570,354 B2 | 2/2017 | Chou et al. | |
| 9,577,061 B2 | 2/2017 | Chou et al. | |
| 9,685,379 B2 | 6/2017 | Chou et al. | |
| 2004/0119135 A1 | 6/2004 | van Bentum et al. | |
| 2004/0137684 A1 | 7/2004 | Ma et al. | |
| 2004/0248364 A1 | 12/2004 | Hsiao et al. | |
| 2007/0049030 A1* | 3/2007 | Sandhu | H01L 21/0337 438/689 |
| 2008/0111185 A1 | 5/2008 | Cheng | |
| 2008/0224210 A1* | 9/2008 | Cai | H01L 21/823412 257/338 |
| 2009/0108347 A1* | 4/2009 | Adkisson | H01L 29/42368 257/339 |
| 2009/0114968 A1 | 5/2009 | Wang et al. | |
| 2009/0212854 A1* | 8/2009 | Baumgartner | H01L 29/4238 327/543 |
| 2009/0230463 A1 | 9/2009 | Carter et al. | |
| 2009/0256214 A1 | 10/2009 | Sun et al. | |
| 2009/0273041 A1* | 11/2009 | Chang | H01L 21/823468 257/408 |
| 2010/0044806 A1 | 2/2010 | Hou et al. | |
| 2011/0298018 A1 | 12/2011 | Yin et al. | |
| 2012/0235244 A1* | 9/2012 | Yin | H01L 21/823807 257/368 |
| 2012/0292700 A1* | 11/2012 | Khakifirooz | H01L 21/84 257/347 |
| 2013/0181287 A1* | 7/2013 | Zhang | H01L 21/26506 257/335 |
| 2013/0248994 A1* | 9/2013 | Ninomiya | H01L 29/407 257/334 |
| 2013/0316511 A1 | 11/2013 | Lenski et al. | |
| 2014/0027783 A1* | 1/2014 | Yin | H01L 21/823431 257/77 |
| 2014/0084387 A1* | 3/2014 | Dewey | H01L 29/0665 257/410 |
| 2014/0210009 A1 | 7/2014 | Xiao | H01L 29/66795 257/365 |
| 2014/0252429 A1 | 9/2014 | Richter et al. | |
| 2014/0252499 A1* | 9/2014 | Lin | H01L 29/42368 257/408 |
| 2014/0273412 A1* | 9/2014 | Wu | H01L 21/0206 438/478 |
| 2014/0361354 A1 | 12/2014 | Ting et al. | |
| 2015/0054074 A1 | 2/2015 | Zhu et al. | |
| 2015/0171166 A1* | 6/2015 | Liu | H01L 29/16 257/369 |
| 2015/0287738 A1* | 10/2015 | Kuo | G11C 5/06 257/326 |
| 2015/0318378 A1* | 11/2015 | Letavic | H01L 29/78 257/343 |
| 2015/0364593 A1 | 12/2015 | Jangjian et al. | |
| 2016/0027899 A1* | 1/2016 | Kim | H01L 21/2822 257/336 |
| 2016/0149013 A1 | 5/2016 | Chou et al. | |
| 2016/0203985 A1 | 7/2016 | Chou et al. | |
| 2016/0203986 A1 | 7/2016 | Chou et al. | |
| 2016/0203987 A1 | 7/2016 | Chou et al. | |
| 2016/0204209 A1 | 7/2016 | Chou et al. | |
| 2016/0204214 A1 | 7/2016 | Chou et al. | |
| 2016/0247900 A1* | 8/2016 | Huang | H01L 29/66795 |
| 2016/0247920 A1* | 8/2016 | Ho | H01L 29/7848 |
| 2016/0260618 A1 | 9/2016 | Chou et al. | |
| 2016/0268390 A1 | 9/2016 | Chou et al. | |

OTHER PUBLICATIONS

Specification "Asymmetric High-K Dielectric for Reducing Gate Induced Drain Leakage" for related U.S. Appl. No. 15/076,021, filed Mar. 21, 2016, 21 pages.
Specification "Asymmetric High-K Dielectric for Reducing Gate Induced Drain Leakage" for related U.S. Appl. No. 15/076,012, filed Mar. 21, 2016, 21 pages.
Specification "Asymmetric High-K Dielectric for Reducing Gate Induced Drain Leakage" for related U.S. Appl. No. 15/075,960, filed Mar. 21, 2016, 22 pages.
Specification "Asymmetric High-K Dielectric for Reducing Gate Induced Drain Leakage" for related U.S. Appl. No. 15/075,944, filed Mar. 21, 2016, 21 pages.
Specification "Asymmetric High-K Dielectric for Reducing Gate Induced Drain Leakage" for related U.S. Appl. No. 15/159,255, filed May 19, 2016, 21 pages.
Specification "Asymmetric High-K Dielectric for Reducing Gate Induced Drain Leakage" for related U.S. Appl. No. 15/159,259, filed May 19, 2016, 21 pages.
Specification "Asymmetric High-K Dielectric for Reducing Gate Induced Drain Leakage" for related U.S. Appl. No. 15/159,269, filed May 19, 2016, 20 pages.
Unknown, "A Method for Fabricating a Replacement Gate MOSFET with an Asymmetric Spacer", IP.com No. IPCOM000237524D, Jun. 19, 2014, 5 pages.
Fathipour et al., "Asymmetric Gate Oxide Thickness Technology for Reduction of Gated Induced Drain Leakage Current in Nanoscale Single Gate SOI MOSFET," Optoelectronic and Microelectronic Materials and Devices, Jul. 28, 2008, pp. 136-139.
Notice of Allowance in the related U.S. Appl. No. 14/553,521 dated Apr. 26, 2016, 17 pages.
Notice of Allowance in related U.S. Appl. No. 15/076,021 dated Sep. 12, 2016, 13 pages.
Office Action in related U.S. Appl. No. 15/076,012 dated Sep. 6, 2016, 11 pages.
Notice of Allowance in related U.S. Appl. No. 15/075,960 dated Sep. 23, 2016, 14 pages.
Notice of Allowance in related U.S. Appl. No. 15/075,944 dated Sep. 16, 2016, 14 pages.
Office Action in related U.S. Appl. No. 15/159,255 dated Oct. 4, 2016, 12 pages.
Office Action in related U.S. Appl. No. 15/159,259 dated Oct. 3, 2016, 14 pages.
Notice of Allowance in related U.S. Appl. No. 15/159,269 dated Oct. 14, 2016, 10 pages.
Office Action from U.S. Appl. No. 15/406,096 dated May 11, 2017, 9 pages.

(56) References Cited

OTHER PUBLICATIONS

Notice of Allowance from U.S. Appl. No. 15/159,259 dated May 15, 2017; 8 pages.
Office Action from U.S. Appl. No. 15/450,508 dated Jul. 13, 2017. 8 pages.
List of IBM Patents or Patent Applications Treated as Related 2 pages.
Specification "Asymmetric High-K Dielectric for Reducing Gate Induced Drain Leakage" and Drawings in U.S. Appl. No. 15/406,096, filed Jan. 13, 2017, 18 pages.
Specification "Asymmetric High-K Dielectric for Reducing Gate Induced Drain Leakage" and Drawings in U.S. Appl. No. 15/450,508, filed Mar. 6, 2017, 18 pages.
Notice of Allowance from U.S. Appl. No. 15/076,012 dated Mar. 16, 2017; 8 pages.
Notice of Allowance from U.S. Appl. No. 15/159,255 dated Feb. 14, 2017; 7 pages.
Office Action from U.S. Appl. No. 15/159,259 dated Mar. 20, 2017; 8 pages.
Notice of Allowance from U.S. Appl. No. 15/406,096 dated Aug. 16, 2017; 8 pages.

\* cited by examiner

ASYMMETRIC HIGH-K DIELECTRIC FOR REDUCING GATE INDUCED DRAIN LEAKAGE

FIELD OF THE INVENTION

The invention relates to semiconductor structures and, more particularly, to an asymmetric high-k dielectric for reducing gate induced drain leakage in high-k MOSFETs and methods of manufacture.

BACKGROUND

MOSFETs that operate above 1.1 V (band gap of silicon) and have thin dielectrics can suffer from Gate Induced Drain Leakage (GIDL). Conventional methods to improve GIDL include reducing extension implant dose; however, this increases FET resistance and hence reduces FET performance. Also, heavily doped extension regions in combination with thinner high-k dielectrics create high gate-induced E-field at the gate-drain overlap region. This high field results in band-to-band tunneling and gate-induced-drain-leakage (GIDL) current. GIDL leakage is significant in long channel FETs as well as eDRAM array-FETs.

SUMMARY

In an aspect of the invention, a method comprises performing an implant process on a high-k dielectric sidewall of a gate structure. The method further comprises performing an oxygen annealing process to grow an oxide region on a drain side of the gate structure, while inhibiting oxide growth on a source side of the gate structure adjacent to a source region.

In an aspect of the invention, a method comprises performing a blocking process on a high-k dielectric sidewall on a source side of a gate structure. The method further comprises performing an oxygen annealing process to grow an oxide region on a drain side of the gate structure, while inhibiting oxide growth on the source side of the gate structure adjacent to a source region.

In an aspect of the invention, a gate structure comprising a gate material on an asymmetrically thick gate dielectric is disclosed. The asymmetrically thick gate dielectric may be comprised of a single or multiple dielectric layers. In one embodiment, the gate dielectric may comprise a high-k dielectric. In other embodiments, the gate dielectric may include a high-k dielectric and an interfacial dielectric. In all embodiments, the asymmetrically thick gate dielectric is thicker on a drain side of the gate structure than a source side of the gate structure.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to an asymmetric high-k dielectric for reducing gate induced drain leakage in high-k MOSFETs and methods of manufacture. More specifically, in embodiments, the processes of the present invention result in a thicker high-k dielectric at a drain side of the device over the extension region, resulting in reduced gate induced drain leakage (GIDL); whereas, a thin high-k dielectric is provided in the remainder of channel and source side to maintain good device performance and short-channel behavior. In embodiments, the processes of the present invention can be implemented in both replacement metal gate (RMG) processes and gate first processes, as well as further implemented in a planar device or a FinFET.

In more specific embodiments, the present invention provides several fabrication processes in order to provide the advantages of the present invention. By way of one example, in a replacement metal gate process, after depositing high-k dielectric for the gate structure, an angled implant of nitrogen is performed to nitridize a portion of one side of the high-k dielectric in an opening formed by removal of a dummy gate, followed by the fabrication of the metal gate (including a planarizing process). The process is then followed by a thermal anneal in oxygen. The nitridized high-k dielectric material, though, blocks oxygen flow while the non-nitridized sidewall allows oxygen to diffuse to the substrate/high-k interface resulting in a growth of thicker oxide on the drain side of the device.

In another illustrative example of a replacement metal gate process, after depositing high-k dielectric for the gate structure, an angled implant is performed at a portion of one side of the sidewall in the replacement metal gate opening to damage the high-k dielectric on the source side. The damaged implant process is followed by a gentle etch to remove the sidewall high-k layer on the source side of the device. In this way, it is possible to remove the sidewall high-k layer on a source side of the device, which is not necessary for FET operation. The removal of the sidewall high-k layer eliminates the pathway for oxygen regrowth on the source side only, during an anneal process. This leaves the drain-side path for oxygen regrowth.

In yet another alternative process, for example, an oxygen blocking mask (e.g., a nitride layer) can be formed over the source side of the device. The oxygen blocking mask will prevent oxygen regrowth on the source side only, during an anneal process. Other processes are also contemplated by the present invention, as described herein.

Figure 1:
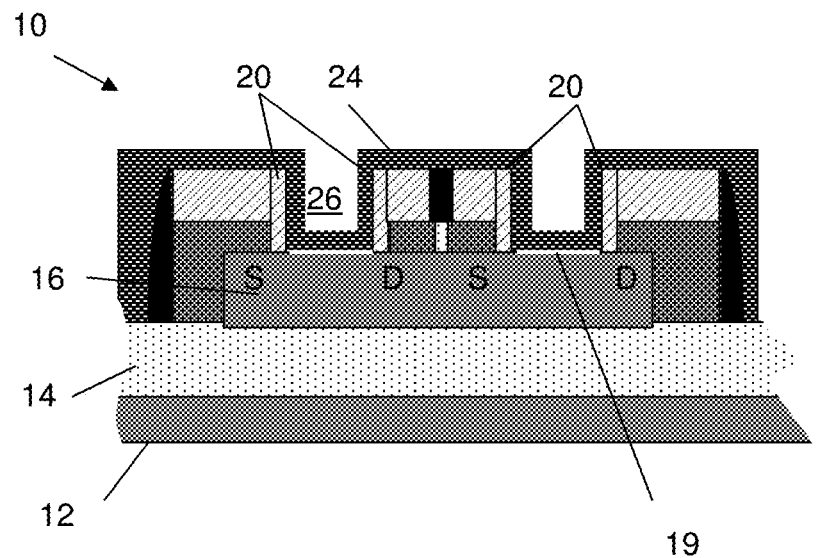
FIGS. 1-3 show structures and respective processing steps in accordance with aspects of the present invention.

FIG. 1 shows a starting point of a fabrication process in accordance with aspects of the present invention. Here, a fin 16 on a silicon on insulator substrate is shown where 14 is the insulator and 12 is the semiconductor substrate. The fin has source regions (S) and drain regions (D). Furthermore, the structure 10 is shown after formation and removal of dummy gate to leave opening 26. The structure 10 may have sidewalls 20. Sidewalls 20, if they exist, are remnants from when the dummy gate was initially formed and source/drain implanted. The sidewalls 20 can be a nitride based material, e.g., SiN; although other materials are also contemplated by the present invention. In addition, there is an interfacial dielectric layer 19. Interfacial dielectric layer 19 may be an oxide of the fin material, and may also contain nitrogen. The interfacial dielectric layer 19 may be formed in a dummy gate formation and remain after dummy gate removal to create opening 26. Or, it may be re-formed after dummy gate removal.

In embodiments, after removal of the dummy gate, a high-k dielectric layer 24 can be formed in the opening 26 to a top of the interfacial layer 19. The high-k dielectric layer 24 can be a material such as a hafnium based material, e.g., $HfO_2$. In embodiments, the high-k dielectric layer 24 can be formed using a blanket deposition process such that the high-k dielectric layer 24 will be formed over sidewalls 20 of the source and drain side of the device, as well as other exposed structures.

Figure 2:
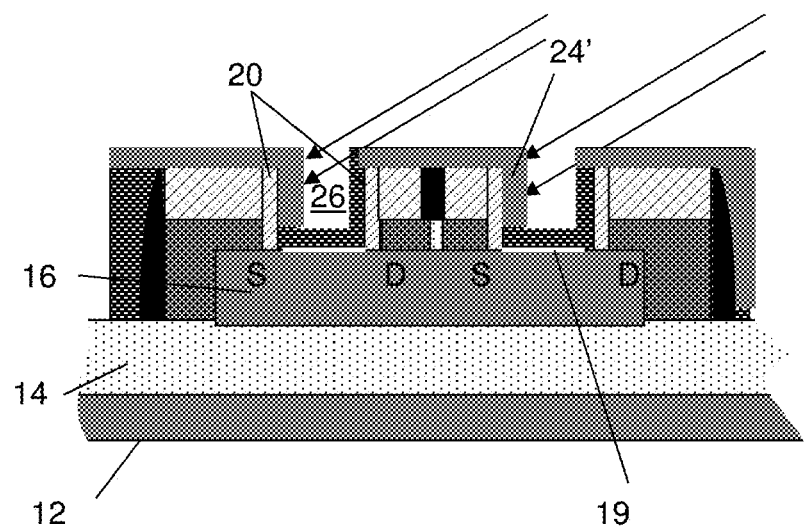

In FIG. 2, an angled implant is performed to implant nitrogen into the high-k dielectric layer 24 on the source side of the device, as represented at reference numeral 24'. In embodiments, the angled implant is an asymmetric nitrogen implant into the source side of the high-k dielectric layer 24, e.g., adjacent to the source region S. The angle of the previous implant depends of the topography of the implanted devices: for a high aspect ratio it will be a more vertical angle. A typical angle will be from 5 to 40 degrees, as a non-limited example. In short channel length devices, e.g., sub 50 nm, the angled implant can be performed without a mask. As described herein, this angled implant of nitrogen will help inhibit $O_2$ ingress through the high-k dielectric layer 24, e.g., $HfO_2$, to the Si substrate, during low temperature oxygen anneal processes.

Figure 3:
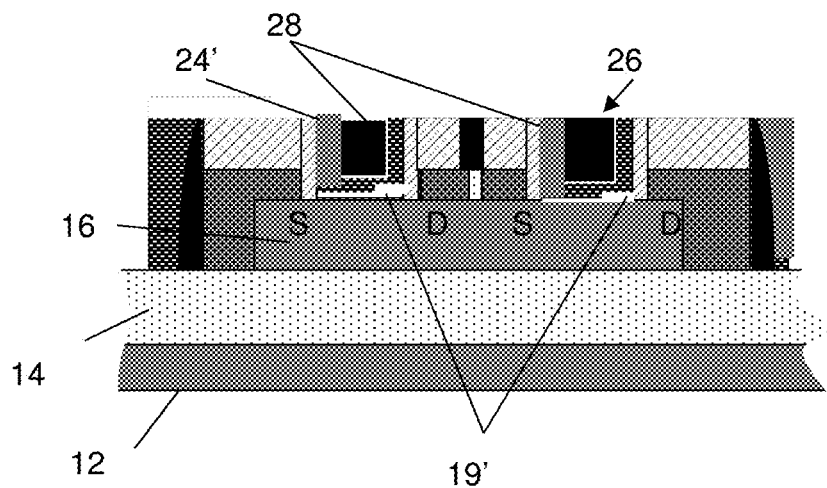

As shown in FIG. 3, a metal gate structure 28 is formed within the opening 26. The metal gate structure 28 can include the deposition of metal materials of different work functions depending on the design parameters of the device. Any metal material, e.g., TiN, deposited on the surface of the structure, e.g., dielectric material, etc., can be removed by a chemical mechanical polishing (CMP) process. The structure then undergoes a low temperature $O_2$ anneal, e.g., 500° C. for about 30 minutes. This low temperature anneal will form a regrowth of oxide to form, e.g., thick oxide layer 19', on the drain side of the device, e.g., adjacent the drain region D; whereas, the nitrogen implanted region 24' will prevent or inhibit $O_2$ ingress on the source side of the device, e.g., adjacent to the source region S, during the thermal anneal process. In embodiments, the thick oxide layer 19' can increase from about 1.5 nm to about 1.8 nm, thereby decreasing the JGIDL by a factor of approximately 266.

Figure 4:
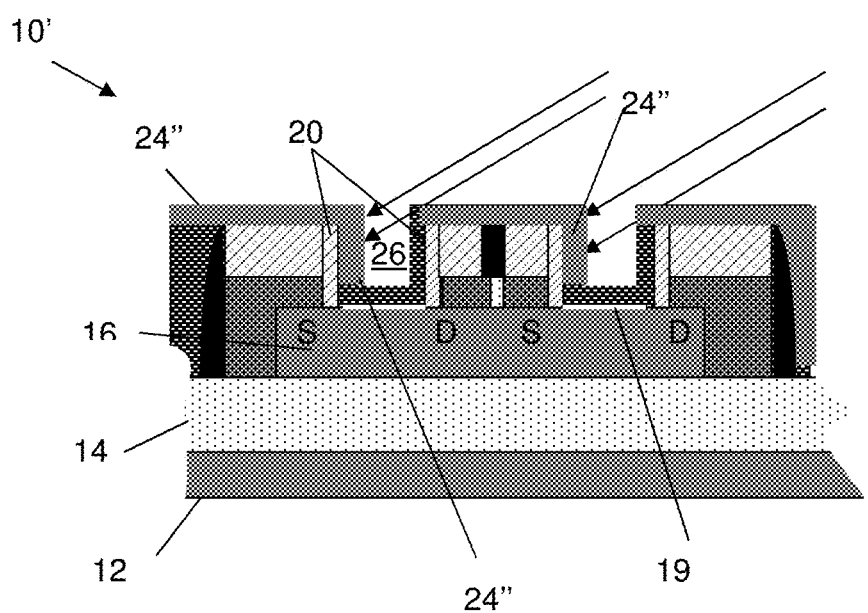
FIGS. 4-6 show structures and respective processing steps in accordance with additional aspects of the present invention.
Figure 5:
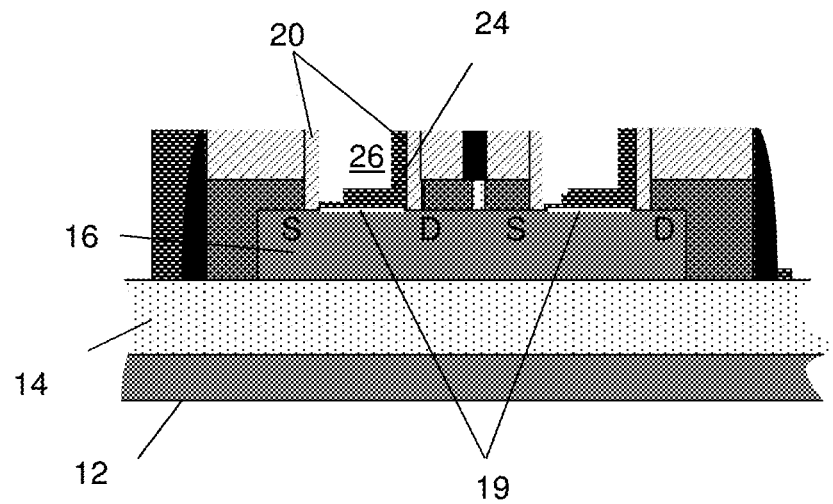
Figure 6:
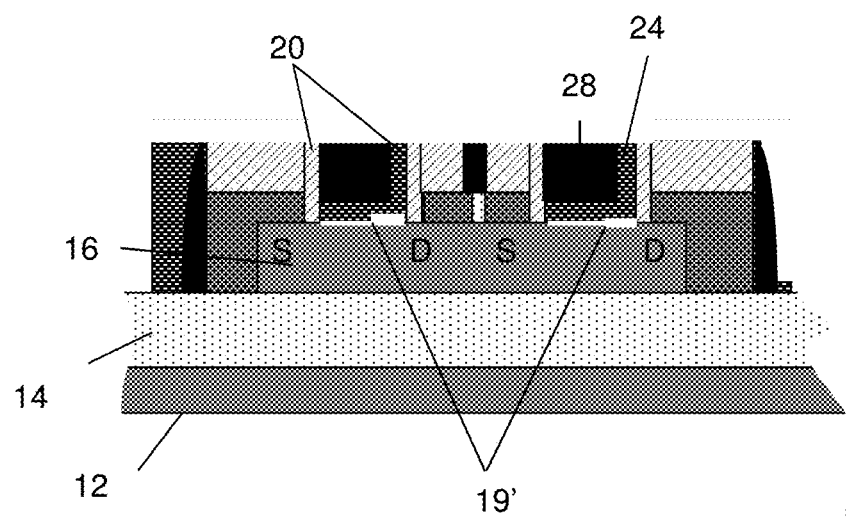

FIGS. 4-6 show structures and respective processing steps in accordance with additional aspects of the present invention. As in the previous aspect of the present invention, the processes of FIGS. 4-6 can be based on replacement metal gate processes, in finFET technologies; although planar devices are also contemplated by the present invention. In particular, in FIG. 4, the structure 10' undergoes an implantation process to damage the high-k dielectric layer 24 on the source side of the device, as representatively shown at reference numeral 24". The damaging implantation process can comprise an oxygen implant or other damaging species including but not limited to Germanium, Xenon, or Argon Energy of the implant will be chosen based on the chosen species to damage only the dielectric layer As shown in FIG. 5, the damaged high-k dielectric layer can then be removed to expose the underlying sidewalls 20 on the source side of the device, e.g., adjacent to the source region S, while leaving the high-k dielectric layer 24 on the sidewalls on the drain side of the device, e.g., adjacent to the drain region D. This removal process will eliminate the pathway for $O_2$ ingression to the Si substrate. The removal process can be a gentle etch removal process, like e.g., a dilute HF process, selective to the damaged layer 24".

As shown in FIG. 6, a metal gate structure 28 is formed within the opening 26. The metal gate structure 28 can include the deposition of metal materials of different work functions depending on the design parameters of the device. Any metal material deposited on the surface of the structure, e.g., dielectric material, etc., can be removed by a chemical mechanical polishing (CMP) process. The structure then undergoes a low temperature $O_2$ anneal, e.g., 500° C. for about 30 minutes. This low temperature anneal will form a regrowth of oxygen 19' on the drain side of the device, e.g., adjacent the drain region D; whereas, the removal of the high-k dielectric material on the source side (e.g., adjacent to the source region S) will prevent $O_2$ regrowth on the source side of the device during this anneal process. In embodiments, the thick oxide layer 19' can increase from about 1.5 nm to about 1.8 nm, thereby decreasing the JGIDL by a factor of approximately 266.

Figure 7:
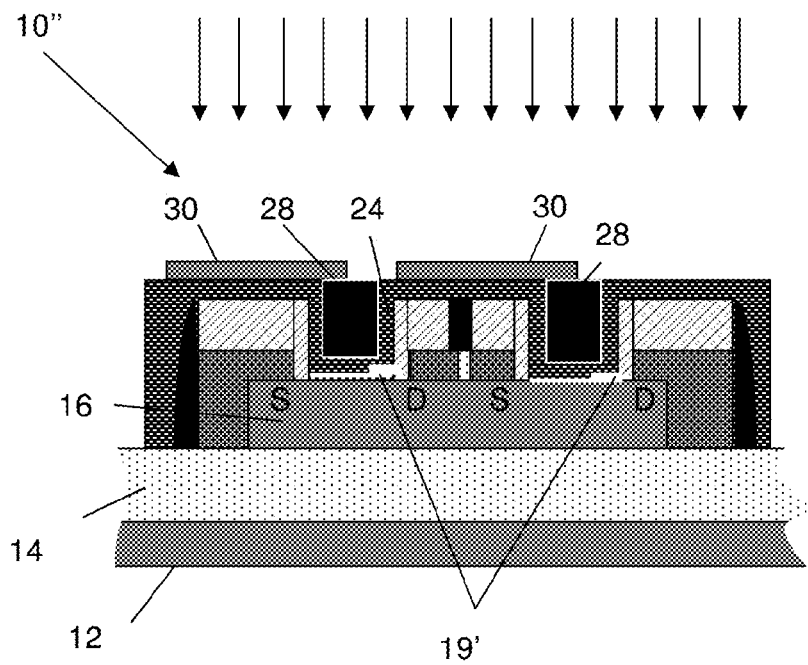
FIGS. 7 and 8 show structures and respective processing steps in accordance with yet additional aspects of the present invention.
Figure 8:
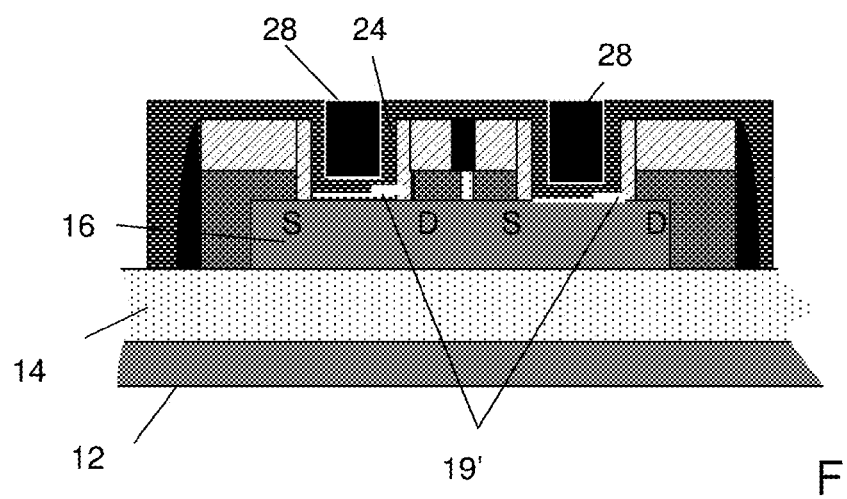

FIGS. 7 and 8 show structures and respective processing steps in accordance with additional aspects of the present invention. As in the previous aspects of the present invention, the processes of FIGS. 7 and 8 can be based on replacement metal gate processes, in finFET technologies; although planar devices are also contemplated by the present invention. In particular, in FIG. 7, the structure 10" includes the deposition of a masking material 30 on a source side of the device, e.g., overlapping a source side of the replacement gate structure 28. In embodiments, the masking material is nitrogen, formed using conventional deposition, lithography and etching processes.

As further shown in FIG. 7, the structure undergoes an anneal process. For example, the structure 10" can undergo a low temperature oxygen anneal, e.g., 500° C. for about 30 minutes. By using the masking material 30 on a source side of the device, e.g., overlapping a source side of the gate structure 28, oxygen will be prevented from channeling into the Si substrate via the high-k 24 (e.g., $HfO_2$) on the sidewall on the source side of the device (e.g., adjacent to the source region S); whereas, regrowth of oxygen 19' will form on the drain side of the device, e.g., adjacent the drain region D. As in any of the aspects of the present invention, the thickness of the regrown thick oxide 19' can be controlled by introducing and adjusting the low temperature $O_2$ anneal. The masking material can then be removed using a conventional etching process, as shown representatively in FIG. 8. In embodiments, the thick oxide layer 19' can increase from about 1.5 nm to about 1.8 nm, thereby decreasing the JGIDL by a factor of approximately 266.

FIGS. 9-12 show structures and respective processing steps using gate first processes. In these processes, an asymmetric high-k dielectric construct is created to increase the oxide thickness at the drain side to limit the gate-induced electric field, leading to smaller GIDL current. The oxide thickness is kept the same at the source side. In the processing steps in FIGS. 9 and 10, an angled oxygen implant is performed after spacer formation. In addition, a RIE can be applied on the drain side to purposely create a poor encapsulation to enhance regrowth. In the processing steps of FIGS. 11 and 12, an alternative approach is to grow a thin $HfO_2$ layer as the first spacer, which will act as a pathway for $O_2$ to reach the gate oxide. In these embodiments, the thick oxide layer can increase from about 1.5 nm to about 1.8 nm, thereby decreasing the JGIDL by a factor of approximately 266.

Figure 9:
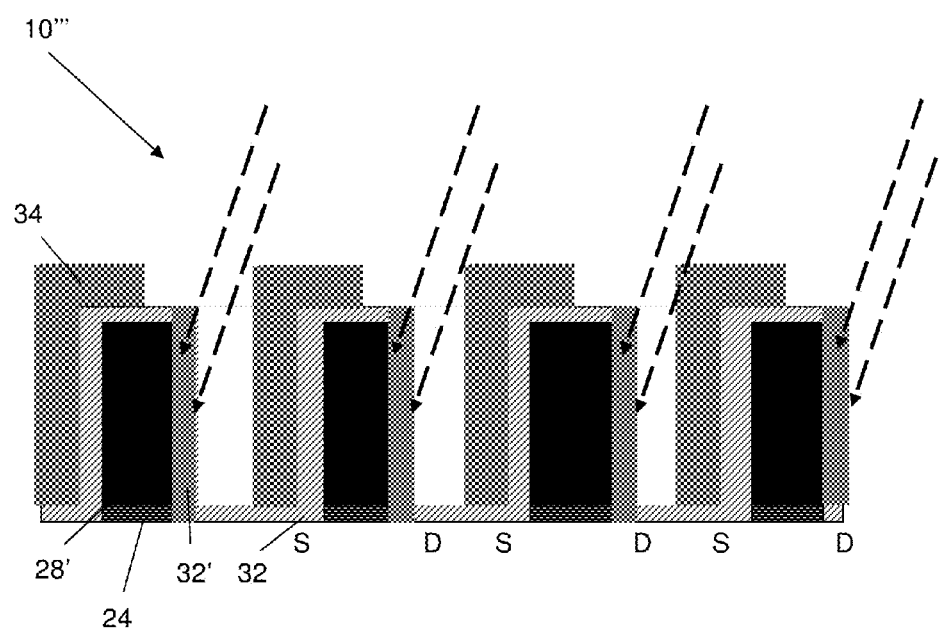
FIGS. 9 and 10 show structures and respective gate first processing steps in accordance with aspects of the present invention.
Figure 10:
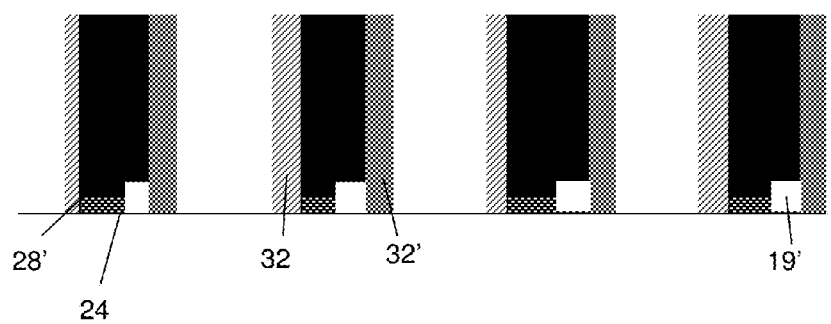

More specifically, in contrast to the previous aspects of the present invention, the processes of FIGS. 9 and 10 show gate oxide regrowth with gate first processes, in finFET technologies; although planar devices are also contemplated by the present invention. In particular, in FIG. 9, the structure 10''' includes a gate material 28' formed on a high-k dielectric material 24, e.g., high-k dielectric material such as HfO$_2$. There may be an intervening interfacial layer ((e.g.) 19 not shown) between the high-k dielectric material 24 and the substrate. A spacer material 32 is deposited on the gate material 28' using conventional deposition processes, e.g., CVD. In embodiments, the spacer material 32 can be Si$_3$N$_4$. A mask 34 is formed on the source side of the device, followed by an angled implant of oxygen or other damaging species, e.g., Germanium, Xenon, Argon or others damaging species, on the drain side. For purposes of this description, the damaging species can also be an etchant used with reactive ion etching processes on the drain side. In either scenario, the spacer material on the drain side of the device becomes damaged, as represented by reference numeral 32'.

In FIG. 10, the mask is removed using a conventional stripping process. For example, the mask can be removed by dry process using N$_2$H$_2$ or a wet process SP. After additional processing, e.g., anisotropic etching of sidewall material, a regrowth of oxygen 19' (thick oxide layer) is formed on the drain side of the device, e.g., adjacent the drain region during low temperature annealing process; whereas, the nitride sidewall on the source side (e.g., adjacent to the source region) will prevent or inhibit O$_2$ ingress on the source side of the device during the anneal process. The device can then undergo further processing including spacer formation followed by halo and extension implant processes.

Figure 11:
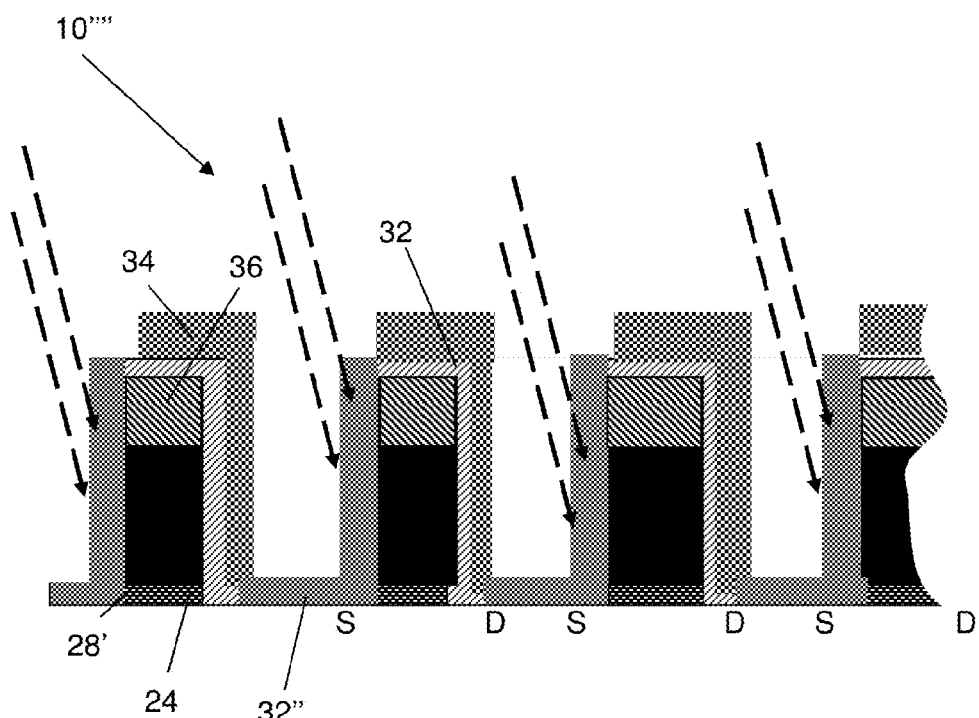
FIGS. 11 and 12 show structures and respective gate first processing steps in accordance with additional aspects of the present invention.
Figure 12:
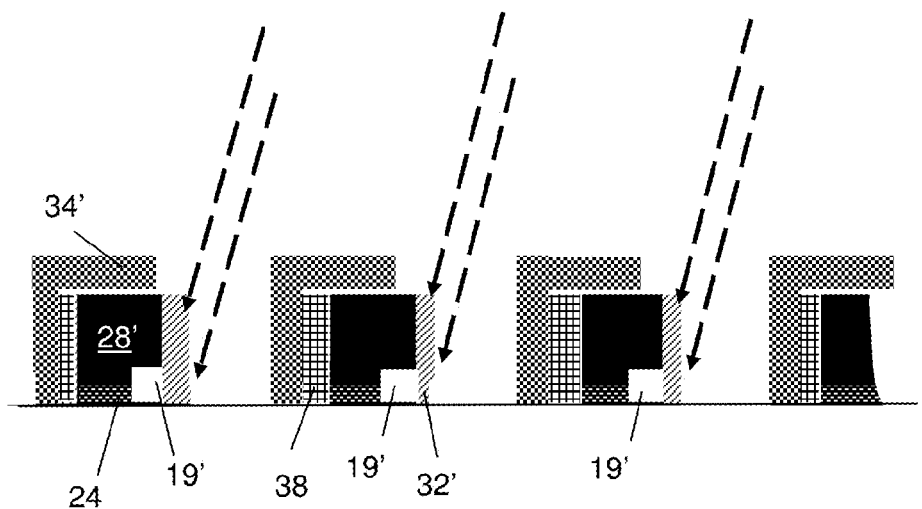

FIGS. 11 and 12 show structures and respective processing steps in accordance with additional aspects of the present invention. As with the structures and fabrication processes shown in FIGS. 9 and 10, the processes of FIGS. 11 and 12 show gate oxide regrowth with gate first processes, in finFET technologies; although planar devices are also contemplated by the present invention. In particular, in FIG. 11, the structure 10'''' includes a gate material 28' formed on a high-k dielectric material 24, e.g., high-k dielectric material such as HfO$_2$. An interfacial dielectric (19 not shown) may be between the high-k and the substrate. A nitride material 36, e.g., Si$_3$N$_4$, is formed on a surface of the gate material 28'. A spacer material 32 is deposited on the structure using conventional deposition processes, e.g., CVD. In embodiments, the spacer material 32 can be a nitride material, e.g., Si$_3$N$_4$. A mask 34 is formed on the drain side of the device, followed by an angled implant of oxygen or other damaging species, e.g., Germanium, Xenon, Argon or other damaging species, to form a damaged region 32'' of the spacer 32 on the source side of the device.

In FIG. 12, the damaged region 32' on the source side of the device is removed using conventional etching processes, selective to the damaged region 32'. The mask is also removed using conventional etching processes, selective to the mask. A second spacer 38 is then deposited on the structure, e.g., exposed portions of the high-k dielectric material 24, gate material 28', nitride material 36 and spacer material 32, using conventional deposition processes, e.g., CVD. In embodiments, the second spacer 38 is a nitride material. The horizontal surfaces of the spacers 32, 38 and the nitride material 36 are then removed using an anisotropic etching process. A mask 34' is then formed, e.g., deposited and patterned, over the source side of the device, followed by removal of the spacer covering the high-k dielectric material 24, formed on the drain side of the device. The structure then undergoes a low temperature anneal process, e.g., 500° C. for about 30 minutes. This low temperature anneal will form a regrowth of oxygen 19' on the drain side of the device, e.g., adjacent the drain region; whereas, the nitride sidewall on the source side of the device will prevent or inhibit O$_2$ ingress during this anneal process. The mask 34' can then be removed, followed by conventional CMOS processes.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A gate structure comprising a gate material on an asymmetrically thick gate dielectric comprising an oxide wherein the asymmetrically thick gate dielectric is thicker on a drain side of the gate structure than a source side of the gate structure, wherein the asymmetrically thick gate dielectric includes a high-k material and an interfacial dielectric layer of fin material under the high-k material, the fin material is on a silicon on insulator (SOI) substrate which includes a source region and a drain region, and a damaged spacer material is only on the drain side of the gate structure.

2. The structure of claim 1, wherein the oxide is a high-k oxide material.

3. The structure of claim 2, wherein the high-k oxide material is HfO$_2$.

4. The structure of claim 1, wherein the interfacial dielectric layer comprises nitrogen.

5. The structure of claim 1, wherein the thick gate dielectric is regrown oxide material on the drain side of the gate structure.

6. The structure of claim 1, wherein the gate structure is a short channel gate structure.

7. The structure of claim 1, wherein the damaged spacer material comprises Si$_3$N$_4$.

8. The structure of claim 1, wherein the interfacial dielectric layer has a first thickness on the source side and a second thickness on the drain side, the first thickness being different than the second thickness.

9. The structure of claim 1, wherein the high-k material on the source side of the gate structure comprises a nitrogen implant.

10. The structure of claim 9, wherein a damaged spacer material on the source side of the gate structure comprises nitrogen.

11. The structure of claim 1, further comprising sidewalls of the high-k material on the source side and the drain side of gate material.

12. The structure of claim 11, wherein the interfacial dielectric layer of fin material is thicker on the drain side of the gate structure than the source side of the gate structure.

13. The structure of claim 1, wherein the high-k material and the damaged spacer material are provided on sidewalls of the gate material.

\* \* \* \* \*